(12) United States Patent
Sakai et al.

(10) Patent No.: US 11,233,126 B2
(45) Date of Patent: Jan. 25, 2022

(54) SiC EPITAXIAL WAFER, SEMICONDUCTOR DEVICE, AND POWER CONVERTER

(71) Applicant: Mitsubishi Electric Corporation, Tokyo (JP)

(72) Inventors: Masashi Sakai, Tokyo (JP); Yoichiro Mitani, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 27 days.

(21) Appl. No.: 16/718,534

(22) Filed: Dec. 18, 2019

(65) Prior Publication Data

US 2020/0279922 A1 Sep. 3, 2020

(30) Foreign Application Priority Data

Mar. 1, 2019 (JP) .............................. JP2019-037891

(51) Int. Cl.
*H01L 29/16* (2006.01)
*H02M 7/48* (2007.01)
*H02M 3/135* (2006.01)
*H01L 29/161* (2006.01)
*H01L 29/66* (2006.01)
(Continued)

(52) U.S. Cl.
CPC ........ *H01L 29/1608* (2013.01); *H01L 29/161* (2013.01); *H01L 29/1604* (2013.01); *H01L 29/165* (2013.01); *H01L 29/36* (2013.01); *H01L 29/66053* (2013.01); *H02M 3/135* (2013.01);
(Continued)

(58) Field of Classification Search
CPC . H01L 29/1608; H01L 29/165; H01L 29/161; H01L 29/66053; H01L 29/36; H01L 29/1604; H01L 7/48; H01L 3/135; H01L 21/02658; H01L 21/02505; H01L 21/0251; H01L 21/02529; H01L 21/02576; H01L 21/0262; H01L 21/02378; H01L 7/5387; H01L 21/02447; H01L 21/0445; H02M 7/48; H02M 3/135; H02M 7/5387
See application file for complete search history.

(56) References Cited

U.S. PATENT DOCUMENTS

2001/0028572 A1* 10/2001 Takanashi ........... H02M 7/5387
363/58
2005/0041444 A1* 2/2005 Inoue ................... H03K 17/168
363/56.02
(Continued)

FOREIGN PATENT DOCUMENTS

| JP | 2011-114252 A | * | 6/2011 | ............. H01L 29/78 |
| JP | 2011114252 A | | 6/2011 | |
| WO | 2016092887 A1 | | 6/2016 | |

*Primary Examiner* — S M Sohel Imtiaz
(74) *Attorney, Agent, or Firm* — Studebaker & Brackett PC (57) ABSTRACT

A SiC epitaxial wafer includes a SiC substrate and a SiC epitaxial layer disposed on the SiC substrate. The SiC epitaxial layer includes a high carrier concentration layer and two low carrier concentration layers having lower carrier concentration than the high carrier concentration layer, and being in contact with a top surface and a bottom surface of the high carrier concentration layer to sandwich the high carrier concentration layer. A difference in carrier concentration between the high carrier concentration layer and the low carrier concentration layers is $5\times10^{14}/cm^3$ or more and $2\times10^{16}/cm^3$ or less.

8 Claims, 4 Drawing Sheets

(51) Int. Cl.
*H01L 29/36* (2006.01)
*H01L 29/165* (2006.01)
*H02M 3/137* (2006.01)
*H02M 3/139* (2006.01)

(52) U.S. Cl.
CPC ........... *H02M 3/137* (2013.01); *H02M 3/139* (2013.01); *H02M 7/48* (2013.01)

(56) References Cited

U.S. PATENT DOCUMENTS

| | | | | |
|---|---|---|---|---|
| 2009/0134405 A1* | 5/2009 | Ota | ..................... | H01L 29/872 |
| | | | | 257/77 |
| 2009/0224818 A1* | 9/2009 | Yoneyama | ................ | H02P 7/04 |
| | | | | 327/333 |
| 2011/0285426 A1* | 11/2011 | Takahashi | ............. | H02M 3/158 |
| | | | | 327/109 |
| 2013/0099253 A1* | 4/2013 | Ohtsuka | ............. | H01L 29/1608 |
| | | | | 257/77 |
| 2014/0246681 A1* | 9/2014 | Das | ..................... | H01L 25/072 |
| | | | | 257/77 |
| 2014/0284619 A1* | 9/2014 | Nishio | .............. | H01L 21/02576 |
| | | | | 257/77 |
| 2014/0312510 A1* | 10/2014 | Satou | ..................... | H01L 23/50 |
| | | | | 257/777 |
| 2015/0028353 A1* | 1/2015 | Mandal | ................ | H01L 31/036 |
| | | | | 257/77 |
| 2017/0092754 A1* | 3/2017 | Ina | ......................... | H02M 7/06 |
| 2018/0083615 A1* | 3/2018 | Kono | .................. | H01L 29/7802 |
| 2018/0277635 A1* | 9/2018 | Wada | ................ | H01L 21/02576 |
| 2019/0067469 A1* | 2/2019 | Hu | .................. | H01L 29/66666 |
| 2019/0148496 A1* | 5/2019 | Ishibashi | ........... | H01L 21/02576 |
| | | | | 257/77 |

* cited by examiner

SIC EPITAXIAL WAFER, SEMICONDUCTOR DEVICE, AND POWER CONVERTER

BACKGROUND OF THE INVENTION

Field of the Invention

The present invention relates to SiC epitaxial wafers.

Description of the Background Art

Silicon carbide (SiC) has superior physical property values of breakdown field strength, saturated electron velocity, thermal conductivity, and the like besides having a larger band gap than silicon (Si), and has superior properties as a material for semiconductor power devices. In particular, a power device manufactured using SiC (hereinafter, referred to as a "SiC power device") can significantly reduce power loss and be reduced in size, allowing for energy conservation at conversion of a power supply power. The SiC power device thus has potential to contribute to higher performance of electric cars, greater functionality of solar cell systems, and the like to become a key device for achievement of a low-carbon society.

In the manufacture of the SiC power device, it is necessary to form an active region of a semiconductor device on a SiC substrate in advance. The active region is formed through epitaxial growth using thermal chemical vapor deposition (CVD) and the like. The active region herein is a region formed while precisely controlling carrier density in crystals and film thickness thereof, and refers to a cross-sectional region including an axis in a direction of growth. Such an epitaxial growth layer is required in addition to the substrate because carrier concentration and film thickness are substantially regulated by design specification of the device, and more precise controllability than that required for carrier concentration of the substrate is required to form the active region.

A wafer including the epitaxial growth layer formed on the SiC substrate is hereinafter referred to as an epitaxial wafer. SiC devices are manufactured by performing various types of processing on the epitaxial wafer. A rate at which devices having desired characteristics are manufactured from a single epitaxial wafer, namely, so-called device yield is thus heavily dependent on uniformity of electric characteristics of the epitaxial growth layer.

That is to say, if a device formation region of the epitaxial wafer includes a local region in which a breakdown field is smaller than that in the other region or in which a relatively large current flows upon application of a certain voltage, a device including the region has poor electric characteristics. For example, poor breakdown voltage characteristics cause a problem in that a leakage current flows upon application of a relatively small voltage. In other words, a primary element regulating the device yield is crystallographic uniformity of the epitaxial wafer. As a factor in impairing the uniformity, a carrot defect observed on the surface of the epitaxial wafer due to a problem at the epitaxial growth is known. The carrot defect is typically caused by internal stress at growth of the epitaxial layer, and causes device failure. In a conventional method, however, a SiC epitaxial wafer in which the carrot defect is sufficiently reduced cannot be obtained.

A SiC crystal has unique periodicity referred to as a polytype. That is to say, SiC crystals having stoichiometry of Si and C of 1:1 and crystal lattices having a hexagonal close-packed structure can have different types of periodicity in atomic arrangement along a c-axis in the structure. Physical properties of SiC are regulated by the periodicity on an atomic scale and symmetry of a crystal lattice. A SiC crystal currently attracting the most attention in terms of device application is that of a type referred to as 4H—SiC. To epitaxially grow the same crystalline form, the surface of a SiC bulk substrate is set to have a plane inclined from certain plane orientation of a crystal, and is typically processed to be a surface inclined at 8° or 4° from a (0001) plane, for example, in a <11-20> direction.

To improve the device yield, a method for improving crystallinity of the SiC bulk substrate and the SiC epitaxial layer has been proposed. For example, Japanese Patent Application Laid-Open No. 2011-114252 and WO 2016/092887 disclose that a layer having high carrier concentration is formed in the SiC epitaxial layer.

According to the invention described in Japanese Patent Application Laid-Open No. 2011-114252 and WO 2016/092887, the device yield is improved by forming the high carrier concentration layer in the SiC epitaxial layer.

In the invention, however, there is an extremely large difference in carrier concentration between the high carrier concentration layer and portions of the SiC epitaxial layer other than the high carrier concentration layer. For example, in Japanese Patent Application Laid-Open No. 2011-114252, a second SiC layer corresponding to the high carrier concentration layer has an impurity concentration of $5 \times 10^{17}$ cm$^{-3}$ or more and $5 \times 10^{18}$ cm$^{-3}$ or less, a first SiC layer and a third SiC layer corresponding to the portions of the SiC epitaxial layer other than the high carrier concentration layer each have an impurity concentration of $1 \times 10^{15}$ cm$^{-3}$ or more and $1 \times 10^{16}$ cm$^{-3}$ or less, and thus a difference in carrier concentration between them is $4.9 \times 10^{17}$ cm$^{-3}$ or more and $4.999 \times 10^{18}$ cm$^{-3}$ or less. In WO 2016/092887, a second epitaxial layer corresponding to the high carrier concentration layer has an impurity concentration of $1 \times 10^{17}$ cm$^{-3}$ or more, a first epitaxial layer and a third epitaxial layer corresponding to the portions of the SiC epitaxial layer other than the high carrier concentration layer each have an impurity concentration of $1 \times 10^{16}$ cm$^{-3}$ or less, and thus a difference in carrier concentration between them is $0.9 \times 10^{17}$ cm$^{-3}$ or more.

Thus, internal stress in the SiC epitaxial layer cannot effectively be relieved, and, further, high carrier concentration of the high carrier concentration layer has an influence on a breakdown voltage of a SiC device chip. An effect of improving the device yield cannot sufficiently be obtained.

SUMMARY

It is an object of the present invention to provide a SiC epitaxial wafer having sufficiently high device yield.

A SiC epitaxial wafer according to the present invention includes a SiC substrate and a SiC epitaxial layer. The SiC epitaxial layer is disposed on the SiC substrate. The SiC epitaxial layer includes a high carrier concentration layer and two low carrier concentration layers. The two low carrier concentration layers have lower carrier concentration than the high carrier concentration layer, and are in contact with a top surface and a bottom surface of the high carrier concentration layer to sandwich the high carrier concentration layer. A difference between carrier concentration of the low carrier concentration layers in regions of contact with the high carrier concentration layer and a maximum value of carrier concentration of the high carrier concentration layer is $5 \times 10^{14}$/cm$^3$ or more and $2 \times 10^{16}$/cm$^3$ or less.

According to the SiC epitaxial wafer according to the present invention, the difference between the carrier concentration of the low carrier concentration layers in the regions of contact with the high carrier concentration layer and the maximum value of the carrier concentration of the high carrier concentration layer is $5\times10^{14}/cm^3$ or more and $2\times10^{16}/cm^3$ or less. This reduces a carrot defect of the SiC epitaxial layer, and improves the device yield.

These and other objects, features, aspects and advantages of the present invention will become more apparent from the following detailed description of the present invention when taken in conjunction with the accompanying drawings.

DESCRIPTION OF THE PREFERRED EMBODIMENTS

A. Embodiment 1

<A-1. Configuration>

A carrot defect is a device killer defect caused by internal stress of a SiC epitaxial layer, and has a linear shape. This defect is known to cause a fatal problem, such as breakdown voltage failure, in particular in a device such as a MOSFET (metal-oxide-semiconductor field-effect transistor) and an IGBT (insulated gate bipolar transistor). The carrot defect is typically caused on the surface of an epitaxial growth layer at a density of approximately $1.0/cm^2$, and has an adverse effect on the device. In a conventional technique, however, a SiC epitaxial wafer in which the carrot defect is sufficiently reduced cannot be obtained.

The present inventors have intensively studied the carrot defect having the adverse effect on the device, and revealed that the carrot defect can significantly be reduced by providing a high carrier concentration layer in the SiC epitaxial layer, and reducing a difference in carrier concentration between the high carrier concentration layer and portions of the SiC epitaxial layer other than the high carrier concentration layer (hereinafter, referred to as "low carrier concentration layers") so that the difference in carrier concentration falls within a fixed range along a thickness of the SiC epitaxial layer. The present inventors have further revealed a relationship between a carrot defect reduction percentage and the difference in carrier concentration between the low carrier concentration layers and the high carrier concentration layer.

Figure 1:
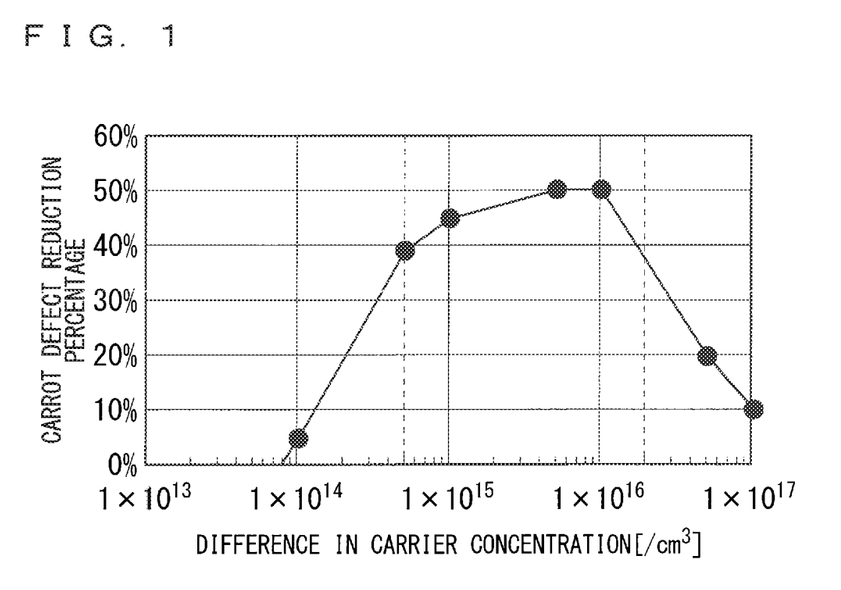
FIG. 1 shows a correlation between a carrot defect reduction percentage and a difference in carrier concentration between low carrier concentration layers and a high carrier concentration layer of a SiC epitaxial layer.

FIG. 1 shows a correlation between the carrot defect reduction percentage and the difference in carrier concentration between the low carrier concentration layers and the high carrier concentration layer of the SiC epitaxial layer. The vertical axis represents the carrot defect reduction percentage. For example, a carrot defect reduction percentage of 50% indicates that the carrot defect has been reduced by 50% compared with a conventional SiC epitaxial wafer not having a configuration in the present embodiment. The horizontal axis represents the difference in carrier concentration between the low carrier concentration layers and the high carrier concentration layer (hereinafter, also simply referred to as a "difference in carrier concentration").

FIG. 1 shows that the carrot defect has significantly been reduced by approximately 40% to approximately 50% when the difference in carrier concentration is $5\times10^{14}/cm^3$ or more and $2\times10^{16}/cm^3$ or less. This is presumably because the internal stress in the SiC epitaxial layer that can cause the carrot defect is effectively relieved by forming the high carrier concentration layer so that the difference in carrier concentration falls within the above-mentioned range, and, consequently, the carrot defect can significantly be suppressed. On the other hand, the internal stress in the SiC epitaxial layer is not sufficiently relieved when the difference in carrier concentration is less than $5\times10^{14}/cm^3$. When the difference in carrier concentration is more than $2\times10^{16}/cm^3$, the difference in carrier concentration between the low carrier concentration layers and the high carrier concentration layer is large enough to cause a lattice mismatch to cause another device killer defect. Furthermore, the difference in carrier concentration of more than $2\times10^{16}/cm^3$ is not preferable because a problem on a breakdown voltage becomes a concern when a SiC device chip is manufactured.

When the high carrier concentration layer has a thickness of less than 0.1 μm, the internal stress in the SiC epitaxial layer cannot sufficiently be relieved. When the high carrier concentration layer has a thickness of more than 0.5 μm, the influence on the breakdown voltage becomes a concern when the SiC device chip is manufactured. It is thus desirable that the high carrier concentration layer have a thickness of 0.1 μm or more and 0.5 μm or less. Two low carrier concentration layers sandwiching the high carrier concentration layer have a carrier concentration of $1\times10^{14}/cm^3$ or more and $1\times10^{16}/cm^3$ or less. The two low carrier concentration layers may herein have the same concentration, and have different concentrations in an allowable range in the design.

Figure 2:
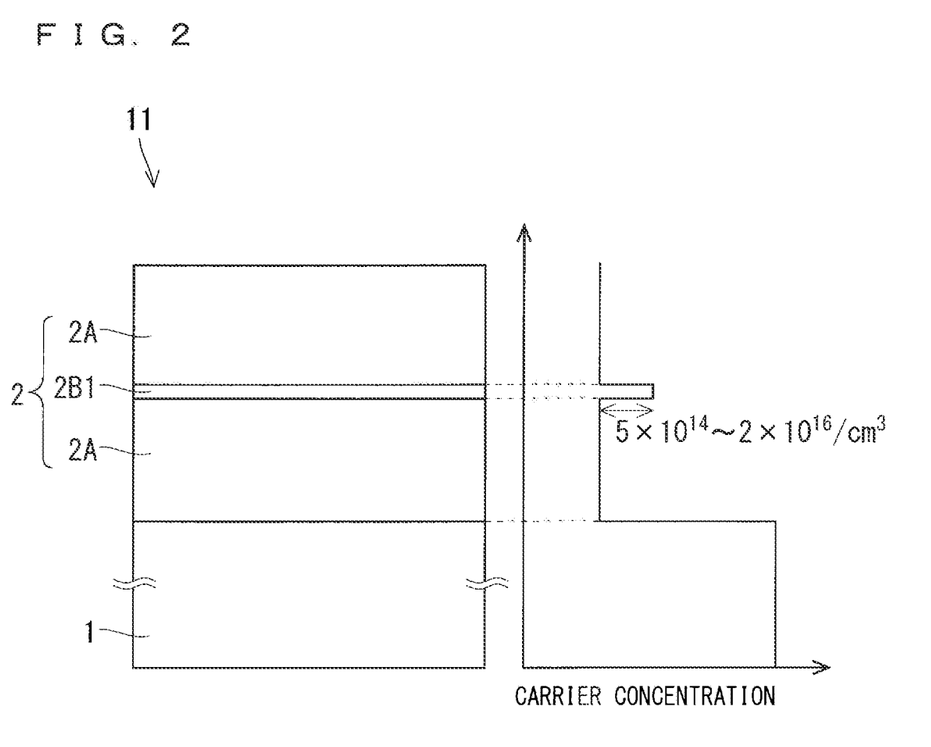
FIG. 2 shows a cross section and carrier concentration of each portion of a SiC epitaxial wafer in Embodiment 1.

FIG. 2 shows a configuration of a SiC epitaxial wafer 11 in Embodiment 1 based on the above-mentioned findings. FIG. 2 shows a cross section and carrier concentration of each portion of the SiC epitaxial wafer 11. The SiC epitaxial wafer 11 includes a SiC substrate 1 and a SiC epitaxial layer 2. The SiC epitaxial layer 2 is formed on a Si face or a C face of the SiC substrate 1 through epitaxial growth. The SiC epitaxial layer 2 includes two low carrier concentration layers 2A and a high carrier concentration layer 2B1. The two low carrier concentration layers 2A are in contact with a top surface and a bottom surface of the high carrier concentration layer 2B1 to sandwich the high carrier concentration layer 2B1. As shown in FIG. 2, the low carrier concentration layers 2A have lower carrier concentration than the SiC substrate 1. The high carrier concentration layer 2B1 has higher carrier concentration than the low carrier concentration layers 2A. The SiC epitaxial layer 2 thereby has discontinuous carrier concentration distribution at interfaces between the high carrier concentration layer 2B1 and the low carrier concentration layers 2A along a thickness of the SiC epitaxial layer 2. The high carrier concentration layer 2B1 has constant carrier concentration along the thickness of the SiC epitaxial layer 2, in other words, along a thickness of the high carrier concentration layer 2B1, and the constant value can be said to be a maximum value of carrier concentration of the high carrier concentration layer 2B1. That is to say, a difference between carrier concentration of the low carrier concentration layers 2A in regions of contact with the high carrier concentration layer 2B1 and the maximum value of the carrier concentration of the high carrier concentration layer 2B1 is $5 \times 10^{14}/cm^3$ or more and $2 \times 10^{16}/cm^{13}$ or less.

<A-2. Manufacturing Method>

A method of manufacturing the SiC epitaxial wafer 11 will be described below.

First, the SiC substrate 1 is prepared. The SiC substrate 1 is obtained, for example, by slicing an ingot grown by sublimation, and mirror polishing the sliced ingot. The SiC substrate 1 is a 4H—SiC n-type substrate doped with nitrogen as an impurity at an impurity concentration of $5.0 \times 10^{17}/cm^3$ or more and $1 \times 10^{20}/cm^3$ or less on average. The SiC substrate 1 has a thickness of 300 μm or more and 400 μm or less. A main surface of the SiC substrate 1 has an inclination angle from a (0001) plane.

Next, as preprocessing prior to processing of SiC epitaxial growth, the SiC substrate 1 is immersed in a mixed solution of heated ammonia water and a hydrogen peroxide solution, and is then further immersed in a mixed solution of heated hydrochloric acid and a hydrogen peroxide solution. After immersed in an aqueous solution containing hydrofluoric acid, the SiC substrate 1 is subjected to substitution using pure water. The surface of the SiC substrate 1 is cleaned by a series of these processes.

The SiC substrate 1 is then placed in a reactor of a CVD apparatus, and the temperature is raised to a desired heating temperature. Hydrogen as a carrier gas and a cleaning gas for the surface of the SiC substrate 1, monosilane and propane as material gases, and nitrogen as a dopant gas are then introduced to start the SiC epitaxial growth.

A SiC epitaxial layer having a carrier concentration of $1 \times 10^{14}/cm^3$ or more and $1 \times 10^{16}/cm^3$ or less is first formed on the SiC substrate 1. The SiC epitaxial layer corresponds to one of the low carrier concentration layers 2A.

A SiC epitaxial layer having a thickness of 0.1 μm or more and 0.5 μm or less is then formed on the low carrier concentration layer 2A under changed growth conditions. The SiC epitaxial layer corresponds to the high carrier concentration layer 2B1. The high carrier concentration layer 2B1 is formed under growth conditions obtained by changing any of a dopant gas flow rate, a material gas flow rate (C/Si ratio), and a growth rate of growth conditions for the low carrier concentration layer 2A. The dopant gas flow rate is changed to increase, and the growth rate is changed to decrease.

A SiC epitaxial layer having a carrier concentration of $1 \times 10^{14}/cm^3$ or more and $1 \times 10^{16}/cm^3$ or less is formed on the high carrier concentration layer 2B1 under further changed growth conditions. The SiC epitaxial layer corresponds to the other one of the low carrier concentration layers 2A.

The SiC epitaxial layer 2 including the low carrier concentration layers 2A and the high carrier concentration layer 2B1 is expected to have a film thickness of approximately 5 μm or more and 30 μm or less, for example, but may have a film thickness of 100 μm or more.

The SiC epitaxial wafer 11 in which the carrot defect is caused at an extremely low density is manufactured by the above-mentioned processes.

In FIG. 2, the SiC epitaxial layer 2 includes a single high carrier concentration layer 2B1. The SiC epitaxial layer 2, however, may include two or more high carrier concentration layers 2B1. That is to say, two or more high carrier concentration layers 2B1 may be formed in the SiC epitaxial layer 2. The depth of formation of the high carrier concentration layer 2B1 has no limit.

<A-3. Modifications>

Figure 3:
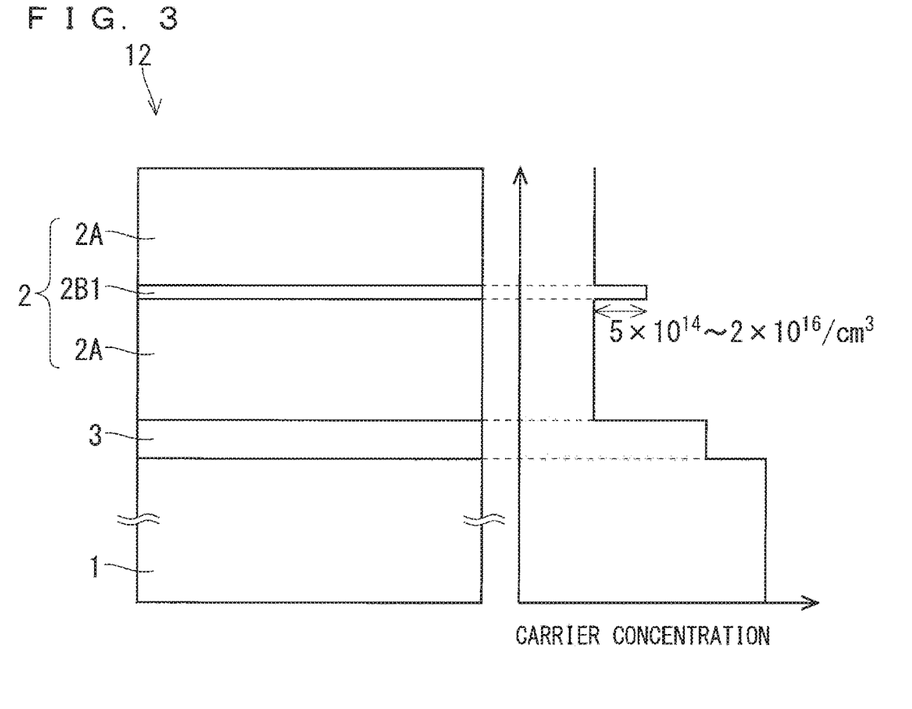
FIG. 3 shows a cross section and carrier concentration of each portion of a SiC epitaxial wafer in a first modification of Embodiment 1.

In the SiC epitaxial wafer 11, a SiC buffer layer may be provided between the SiC substrate 1 and the SiC epitaxial layer 2. FIG. 3 shows a cross section and carrier concentration of each portion of such a SiC epitaxial wafer 12 in a first modification. The SiC epitaxial wafer 12 includes a SiC buffer layer 3 between the SiC substrate 1 and the SiC epitaxial layer 2, and the other configuration is similar to the configuration of the SiC epitaxial wafer 11. FIG. 3 shows that the SiC buffer layer 3 has carrier concentration lower than that of the SiC substrate 1 and higher than that of the high carrier concentration layer 2B1. The SiC buffer layer 3, however, may have higher carrier concentration or lower carrier concentration than the SiC substrate 1.

A method of manufacturing the SiC epitaxial wafer 12 is the above-mentioned method of manufacturing the SiC epitaxial wafer 11 to which a process of forming the SiC buffer layer 3 is added. The SiC buffer layer 3 is formed on the SiC substrate 1 after the surface of the SiC substrate 1 is cleaned. The epitaxial growth is then performed on the SiC buffer layer 3 to form the low carrier concentration layers 2A and the high carrier concentration layer 2B1 to thereby obtain the SiC epitaxial wafer 12.

Figure 4:
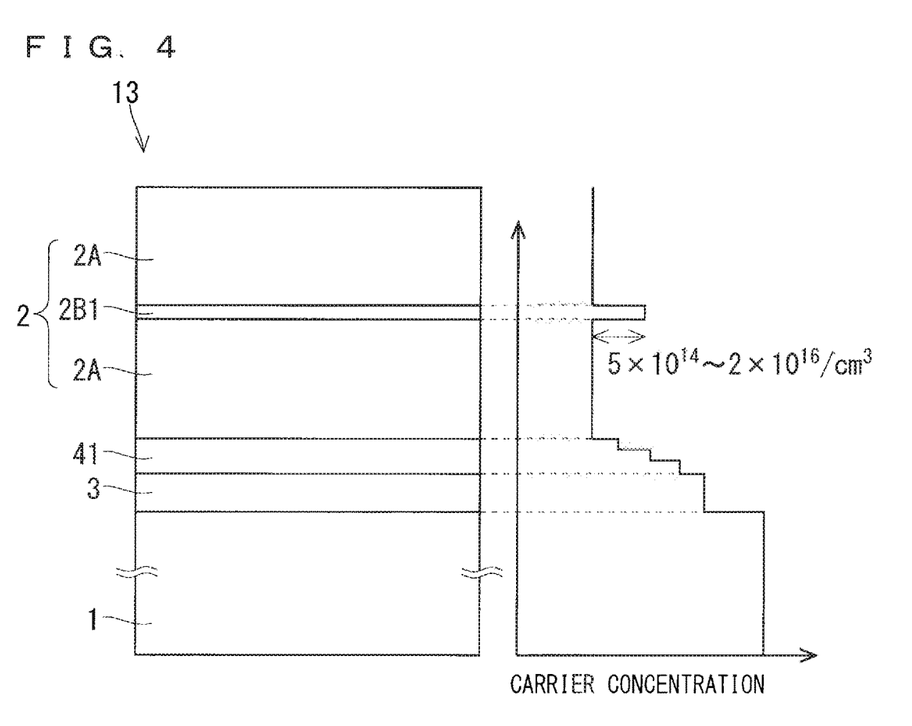
FIG. 4 shows a cross section and carrier concentration of each portion of a SiC epitaxial wafer in a second modification of Embodiment 1.
Figure 5:
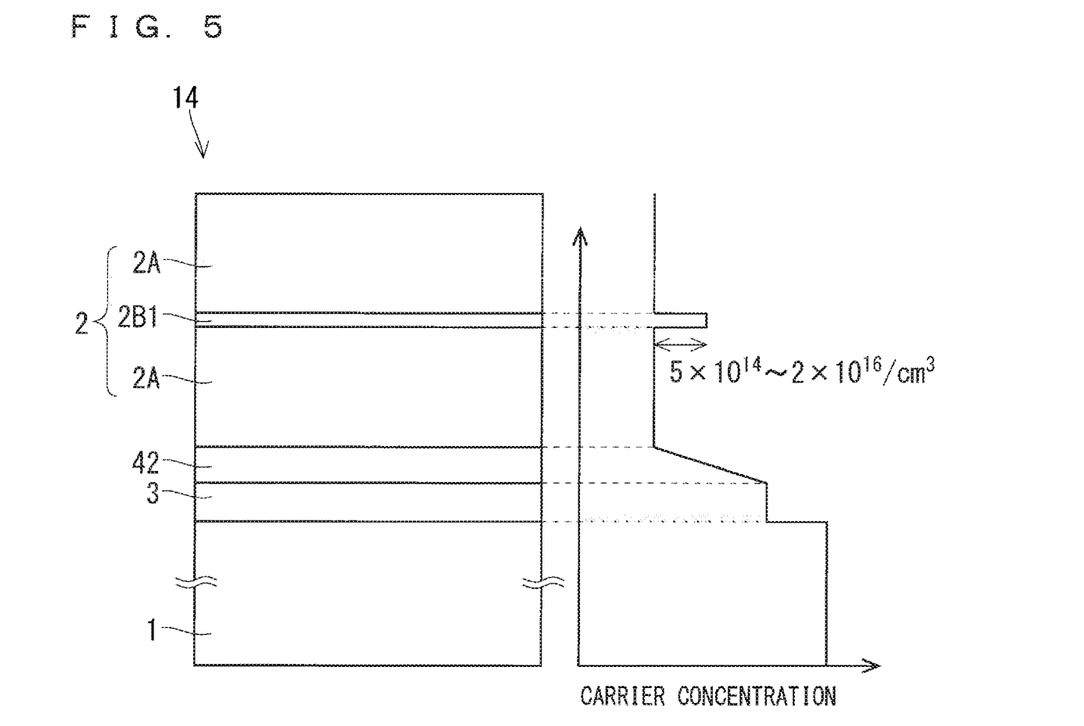
FIG. 5 shows a cross section and carrier concentration of each portion of a SiC epitaxial wafer in a third modification of Embodiment 1.

In the SiC epitaxial wafer 12, a concentration gradient layer may be provided between the SiC epitaxial layer 2 and the SiC buffer layer 3. FIGS. 4 and 5 each show a configuration of such a SiC epitaxial wafer 12 in a modification. FIG. 4 shows a cross section and carrier concentration of each portion of a SiC epitaxial wafer 13 in a second modification, and FIG. 5 shows a cross section and carrier concentration of each portion of a SiC epitaxial wafer 14 in a third modification.

The SiC epitaxial wafer 13 includes a concentration gradient layer 41 between the SiC epitaxial layer 2 and the SiC buffer layer 3, and the other configuration is similar to the configuration of the SiC epitaxial wafer 12. As shown in FIG. 4, in the SiC epitaxial wafer 13, the concentration gradient layer 41 is set to have carrier concentration decreasing stepwise from the SiC buffer layer 3 to the SiC epitaxial layer 2.

The SiC epitaxial wafer 14 includes a concentration gradient layer 42 between the SiC epitaxial layer 2 and the SiC buffer layer 3, and the other configuration is similar to the configuration of the SiC epitaxial wafer 12. As shown in FIG. 5, in the SiC epitaxial wafer 14, the concentration gradient layer 42 is set to have carrier concentration decreasing continuously from the SiC buffer layer 3 to the SiC epitaxial layer 2.

The SiC epitaxial wafers 13 and 14 are each manufactured by the above-mentioned method of manufacturing the SiC epitaxial wafer 12 to which a process of forming the concentration gradient layer 41 or 42 is added. The concentration gradient layers 41 and 42 are formed, after formation of the SiC buffer layer 3, on the SiC buffer layer 3 under adjusted growth conditions for the epitaxial wafer.

<A-4. Effects>

The SiC epitaxial wafer 11 in Embodiment 1 includes the SiC substrate 1 and the SiC epitaxial layer 2 disposed on the SiC substrate 1. The SiC epitaxial layer 2 includes the high carrier concentration layer 2B1 and the two low carrier concentration layers 2A having lower carrier concentration than the high carrier concentration layer 2B1, and being in contact with the top surface and the bottom surface of the high carrier concentration layer 2B1 to sandwich the high carrier concentration layer 2B1. The difference between the carrier concentration of the low carrier concentration layers in the regions of contact with the high carrier concentration layer and the maximum value of the carrier concentration of the high carrier concentration layer is $5\times10^{14}/cm^3$ or more and $2\times10^{16}/cm^3$ or less. The internal stress in the SiC epitaxial layer 2 can thus effectively be relieved, and the carrot defect can significantly be reduced. This can reduce the density of the device killer defect to improve the device yield.

B. Embodiment 2

In Embodiment 2, components similar to components described in Embodiment 1 bear the same reference signs as those in Embodiment 1, and detailed description thereof is omitted as appropriate.

<B-1. Configuration>

Figure 6:
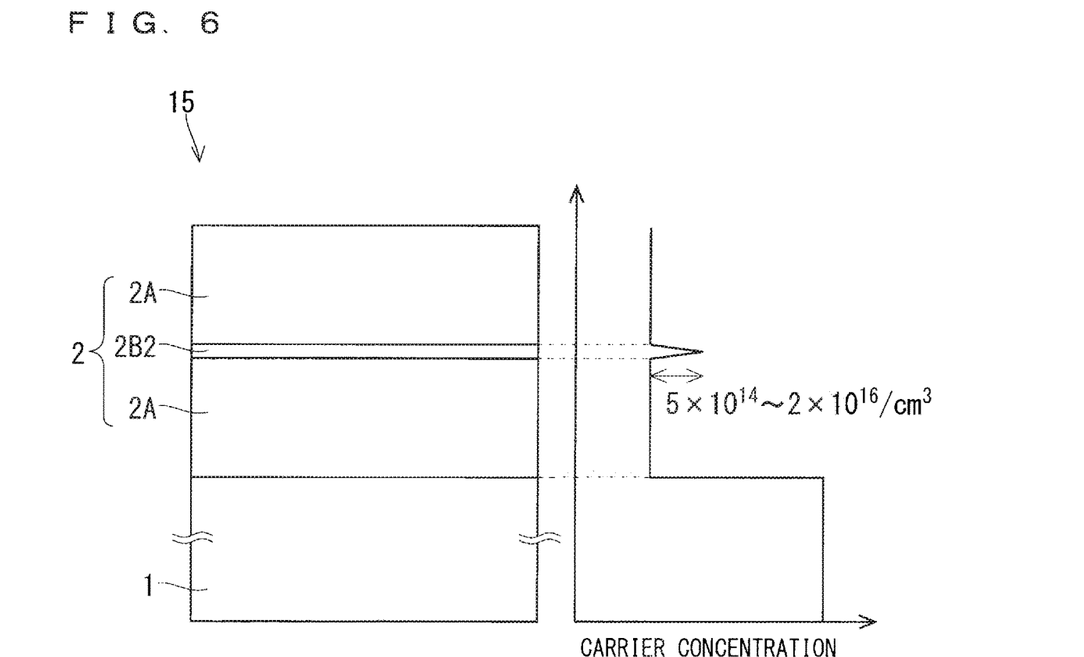
FIG. 6 shows a cross section and carrier concentration of each portion of a SiC epitaxial wafer in Embodiment 2.

FIG. 6 shows a cross section and carrier concentration of each portion of a SiC epitaxial wafer 15 in Embodiment 2. Compared with the SiC epitaxial wafer 11 in Embodiment 1, the SiC epitaxial wafer 15 includes the SiC epitaxial layer 2 including a high carrier concentration layer 2B2 in place of the high carrier concentration layer 2B1, and, in the other respects, is similar to the SiC epitaxial wafer 11.

The high carrier concentration layer 2B1 has a constant carrier concentration profile along the thickness thereof. In contrast, the high carrier concentration layer 2B2 has a wedge-shaped carrier concentration profile along a thickness thereof. In other words, the high carrier concentration layer 2B2 has, inside thereof, a maximum point at which the carrier concentration is the highest, and has a carrier concentration profile in which the carrier concentration increases continuously from the top surface and the bottom surface to the maximum point of the high carrier concentration layer 2B2 along the thickness of the SiC epitaxial layer 2. The difference in carrier concentration between the low carrier concentration layers 2A and the high carrier concentration layer 2B2 at the maximum point is $5\times10^{14}/cm^3$ or more and $2\times10^{16}/cm^3$ or less. It is desirable that the high carrier concentration layer 2B2 have a thickness of 0.1 µm or more and 0.5 µm or less for a similar reason to that in Embodiment 1. The low carrier concentration layers 2A have a carrier concentration of $1\times10^{14}/cm^3$ or more and $1\times10^{16}/cm^3$ or less.

<B-2. Manufacturing Method>

The SiC epitaxial wafer 15 is obtained by forming the high carrier concentration layer 2B2 in place of the high carrier concentration layer 2B1 in a process of manufacturing the SiC epitaxial wafer 11 described in Embodiment 1. Specifically, epitaxial growth conditions are gradually changed, after formation of one of the low carrier concentration layers 2A, to increase the carrier concentration of an epitaxial growth layer, and are gradually returned to the conditions at formation of the low carrier concentration layer 2A when the difference in carrier concentration from the low carrier concentration layer 2A reaches $5\times10^{14}/cm^3$ or more and $2\times10^{16}/cm^3$ or less to thereby obtain the high carrier concentration layer 2B2.

<B-3. Effects>

In the SiC epitaxial wafer 15 in Embodiment 2, the high carrier concentration layer 2B2 has, inside thereof, the maximum point at which the carrier concentration is the highest, and the carrier concentration increases continuously from the top surface and the bottom surface to the maximum point of the high carrier concentration layer 2B2 along the thickness of the SiC epitaxial layer 2. As described above, the high carrier concentration layer 2B2 has the wedge-shaped carrier concentration profile to relieve the lattice mismatch between the low carrier concentration layers 2A and the high carrier concentration layer 2B2 to further reduce the density of the carrot defect.

C. Embodiment 3

In Embodiment 3, a semiconductor device formed using any of the SiC epitaxial wafers 11 to 15 in Embodiments 1 and 2 described above is applied to a power converter. Although application of the SiC epitaxial wafers 11 to 15 is not limited to application to a particular power converter, a case where the SiC epitaxial wafer 11 is applied to a three-phase inverter will be described below in Embodiment 3.

Figure 7:
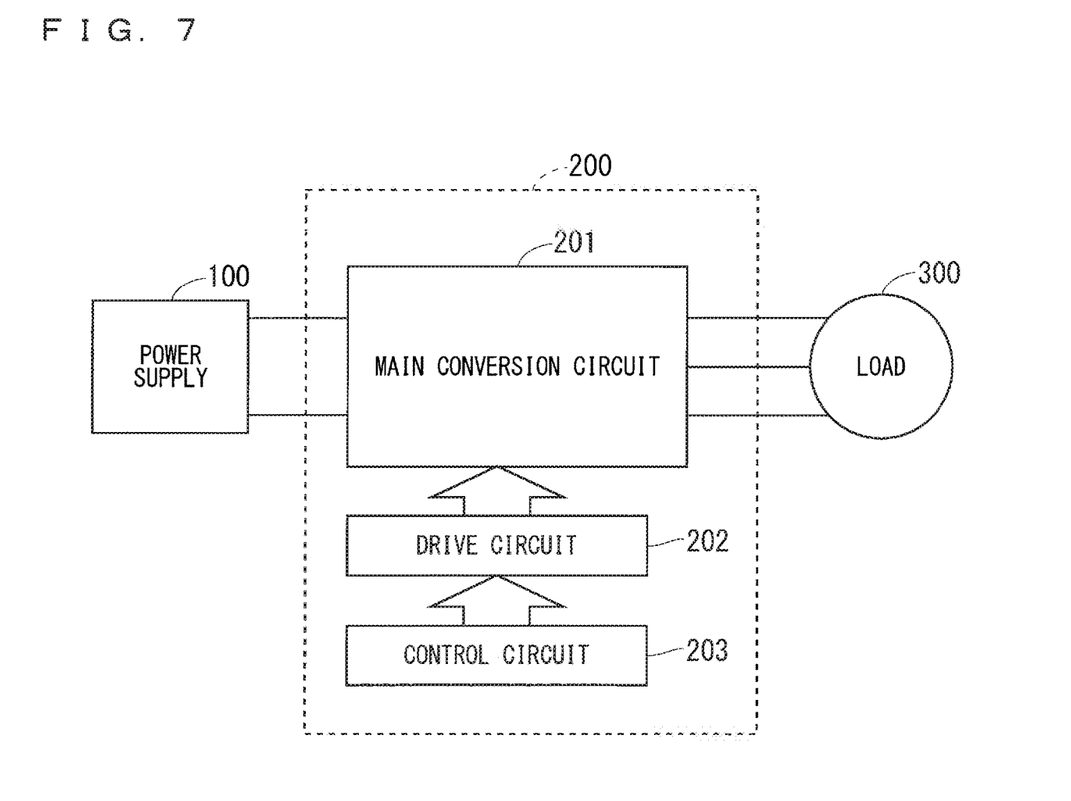
FIG. 7 is a block diagram showing a configuration of a power conversion system to which a power converter in Embodiment 3 is applied.

FIG. 7 is a block diagram showing a configuration of a power conversion system to which a power converter in Embodiment 3 is applied. The power conversion system shown in FIG. 7 includes a power supply 100, a power converter 200, and a load 300. The power supply 100 is a DC power supply, and supplies a DC power to the power converter 200. The power supply 100 can be configured by various components. For example, the power supply 100 can be configured by a DC system, a solar cell, or a storage cell, and may be configured by a rectifying circuit or an AC/DC converter connected to an AC system. The power supply 100 may also be configured by a DC/DC converter that converts a DC power output from a DC system into a predetermined power. The power converter 200 is a three-phase inverter connected between the power supply 100 and the load 300, and converts the DC power supplied from the power supply 100 into an AC power, and supplies the AC power to the load 300. As shown in FIG. 7, the power converter 200 includes a main conversion circuit 201 converting the DC power into the AC power and outputting the AC power, a drive circuit 202 outputting a drive signal for driving each switching element of the main conversion circuit 201, and a control circuit 203 outputting, to the drive circuit 202, a control signal for controlling the drive circuit 202.

The load 300 is a three-phase motor driven by the AC power supplied from the power converter 200. The load 300 is not limited to that for a particular application, is a motor mounted on various types of electrical equipment, and is used as a motor for a hybrid car, an electric car, a railroad car, an elevator, or air-conditioning equipment, for example.

Details of the power converter 200 will be described below. The main conversion circuit 201 includes switching elements and freewheeling diodes (not shown), converts the DC power supplied from the power supply 100 into the AC power through switching of the switching elements, and supplies the AC power to the load 300. Although the main conversion circuit 201 has various specific circuit configurations, the main conversion circuit 201 in the present embodiment is a two-level three-phase full-bridge circuit, and includes six switching elements and six freewheeling diodes anti-parallel to the respective switching elements. A semiconductor device formed using any of the SiC epitaxial wafers 11 to 15 in Embodiments 1 and 2 described above is applied as each of the switching elements of the main conversion circuit 201. Each two of the six switching elements are connected in series to constitute upper and lower arms, and pairs of upper and lower arms constitute respective phases (a U-phase, a V-phase, and a W-phase) of the full-bridge circuit. Output terminals of the respective pairs of upper and lower arms, that is, three output terminals of the main conversion circuit 201 are connected to the load 300.

The drive circuit 202 generates the drive signal for driving each of the switching elements of the main conversion circuit 201, and supplies the drive signal to a control electrode of each of the switching elements of the main conversion circuit 201. Specifically, the drive circuit 202 outputs, to the control electrode of each of the switching elements, a drive signal for switching on the switching element and a drive signal for switching off the switching element in accordance with the control signal from the control circuit 203, which will be described below. The drive signal is a voltage signal (an on signal) equal to or higher than a threshold voltage of the switching element in a case where the switching element is maintained in an on state, and is a voltage signal (an off signal) equal to or lower than the threshold voltage of the switching element in a case where the switching element is maintained in an off state.

The control circuit 203 controls the switching elements of the main conversion circuit 201 so that a desired power is supplied to the load 300. Specifically, the control circuit 203 calculates a time (an on time) during which each of the switching elements of the main conversion circuit 201 has to be in the on state based on a power to be supplied to the load 300. For example, the main conversion circuit 201 can be controlled through PWM control for modulating the on time of each of the switching elements in accordance with a voltage to be output. The control circuit 203 outputs a control command (the control signal) to the drive circuit 202 so that the on signal is output to a switching element that has to be in the on state, and the off signal is output to a switching element that has to be in the off state at each time. The drive circuit 202 outputs the on signal or the off signal as the drive signal to the control electrode of each of the switching elements in accordance with the control signal.

In the power converter in the present embodiment, the semiconductor device formed using any of the SiC epitaxial wafers 11 to 15 in Embodiments 1 and 2 is applied as each of the switching elements of the main conversion circuit 201. Since the carrot defect is significantly reduced in each of the SiC epitaxial wafers 11 to 15, the semiconductor device formed using any of the SiC epitaxial wafers 11 to 15 can have high device yield due to reduction in density of the device killer defect. The power converter in the present embodiment can thus similarly have high yield.

Although an example in which the SiC epitaxial wafers 11 to 15 in Embodiments 1 and 2 are applied to the two-level three-phase inverter is described in Embodiment 3, application of the SiC epitaxial wafers 11 to 15 is not limited to that in this example, and the SiC epitaxial wafers 11 to 15 are applicable to various power converters. For example, the power converter may not be the two-level power converter but may be a three-level or multi-level power converter. In a case where a power is supplied to a single-phase load, the SiC epitaxial wafers 11 to 15 in Embodiments 1 and 2 may be applied to a single-phase inverter. In a case where a power is supplied to a DC load and the like, the SiC epitaxial wafers 11 to 15 in Embodiments 1 and 2 are applicable to the DC/DC converter or the AC/DC converter.

The power converter to which the SiC epitaxial wafers 11 to 15 in Embodiments 1 and 2 are applied is not limited to that in a case where the above-mentioned load is a motor, can be used as a power supply apparatus for an electric discharge machine, a laser machine, an induction cooker, or a contactless power supply system, and can further be used as a power conditioner for a photovoltaic system, a storage system, or the like.

Embodiments of the present invention can freely be combined with each other, and can be modified or omitted as appropriate within the scope of the invention.

While the invention has been shown and described in detail, the foregoing description is in all aspects illustrative and not restrictive. It is therefore understood that numerous modifications and variations can be devised without departing from the scope of the invention.

What is claimed is:

1. A SiC epitaxial wafer comprising: a SiC substrate; and a SiC epitaxial layer disposed on the SiC substrate,
wherein the SiC epitaxial layer includes a high carrier concentration layer, and two low carrier concentration layers having lower carrier concentration than the high carrier concentration layer, and
being in contact with a top surface and a bottom surface of the high carrier concentration layer to sandwich the high carder concentration layer, and
a difference between carrier concentration of the low carrier concentration layers in regions of contact with the high carrier concentration layer and a maximum value of carrier concentration of the high carrier concentration layer is $5\times10^{14}/cm^3$ or more and $2\times10^{16}/cm^3$ or less;
wherein an occurrence of carrot defects in the SiC epitaxial layer is reduced by approximately 40% or more.

2. The SiC epitaxial wafer according to claim 1, wherein the high carrier concentration layer has constant carrier concentration along a thickness of the SiC epitaxial layer.

3. The SiC epitaxial wafer according to claim 1, wherein the high carrier concentration layer has, inside thereof, a maximum point at which the carrier concentration of the high carrier concentration layer has the maximum value, and
the carrier concentration of the high carrier concentration layer increases continuously from the top surface and the bottom surface to the maximum point along a thickness of the SiC epitaxial layer.

4. The SiC epitaxial wafer according to claim 1, wherein the high carrier concentration layer has a thickness of 0.1 μm or more and 0.5 μm or less.

5. The SiC epitaxial wafer according to claim 1, wherein the low carrier concentration layers have a carrier concentration of $1\times10^{14}/cm^3$ or more and $1\times10^{16}/cm^3$ or less.

6. A semiconductor device formed using the SiC epitaxial wafer according to claim 1.

7. A power converter comprising:
a main conversion circuit including the semiconductor device according to claim 6, and converting a power as input and outputting the converted power;
a drive circuit outputting, to the semiconductor device, a drive signal for driving the semiconductor device; and
a control circuit outputting, to the drive circuit, a control signal for controlling the drive circuit.

8. The SiC epitaxial wafer according to claim 1, wherein the low carrier concentration layers have a carrier concentration of $1\times10^{14}/cm^3$ or more and less than $1\times10^{15}/cm^3$.

* * * * *